United States Patent [19]
Whitney et al.

[11] Patent Number: 5,637,993
[45] Date of Patent: Jun. 10, 1997

[54] ERROR COMPENSATED CURRENT MIRROR

[75] Inventors: David H. Whitney, Westford; Moshe Gerstanhaber, Newton, both of Mass.

[73] Assignee: Analog Devices, Inc., Norwood, Mass.

[21] Appl. No.: 543,809

[22] Filed: Oct. 16, 1995

[51] Int. Cl.$^6$ .............................. G05F 3/16; G05F 3/20
[52] U.S. Cl. ............................................. 323/315; 330/288
[58] Field of Search .................................. 323/312, 315; 330/257, 288; 327/362

[56] References Cited

U.S. PATENT DOCUMENTS

| | | | |
|---|---|---|---|
| 4,792,748 | 12/1988 | Thomas et al. | 323/315 |
| 4,879,520 | 11/1989 | Cotreau | 330/257 |
| 5,200,654 | 4/1993 | Archer | 327/362 |
| 5,321,371 | 6/1994 | Harvey | 330/288 |
| 5,512,815 | 4/1996 | Schrader | 323/315 |
| 5,530,340 | 6/1996 | Hayakawa et al. | 323/315 |

*Primary Examiner*—Stuart N. Hecker
*Attorney, Agent, or Firm*—Iandiorio & Teska

[57] ABSTRACT

An error compensated current mirror includes a current mirror circuit having an input transistor and an output transistor; a bias current source in series with the input transistor and a load current source in series with said output transistor; the load current source including a load current source transistor in series with a load current source impedance; an input terminal connected between the bias current source and the input transistor; a buffer circuit including a transistor having its base connected between the load current source and the output transistor; a buffer biasing current source connected in series with the buffer circuit, the buffer biasing current source including a buffer biasing current source transistor in series with a buffer biasing current source impedance; said buffer biasing current source transistor being a replica device of the output transistor; an output terminal connected between the buffer circuit and the buffer biasing current source; and a compensating circuit including a compensator transistor having its base tied to the base of the buffer biasing current source transistor, its emitter connected between the buffer transistor and the buffer biasing current source impedance and its collector connected between the load current source impedance and the load current source transistor for driving the load current source to supply a current to the output transistor which is matched to that demanded by the buffer biasing current source transistor.

2 Claims, 1 Drawing Sheet

5,637,993

ERROR COMPENSATED CURRENT MIRROR

FIELD OF INVENTION

This invention relates to an improved error compensated current mirror which compensates for both Early and thermal errors.

BACKGROUND OF INVENTION

Current mirror structures serve to produce output currents which are accurately scaled to their input currents. Two major error sources are low output impedance and thermal mismatch. Thermal errors occur because the mirror input and output semiconductor devices, although made by the same technology and in close proximity on the same wafer, still may be subjected to temperature differences which take a long time to equilibrate. For example, often the two devices such as bipolar transistors are separated by a dielectric such as glass which is a poor thermal conductor. Thus when the output device voltage varies its thermal variations are not instantaneously communicated to the input device and so their collector currents will not be exactly matched. Thus the output will not follow accurately the input and errors will occur. For bipolar transistors, the Early voltage phenomenon causes the output device to perform as if there is an impedance across its collector and emitter in parallel with the load impedance and diverting current that should be flowing through the load impedance. This interferes with the output accuracy in tracking the input. There is no offsetting Early voltage effect on the input device because it has its base and collector connected together thereby holding constant the voltage across its collector and emitter. Similar problems occur in current mirrors implemented with other semiconductor devices, e.g. FET's. One conventional solution to both these problems is to introduce another cascode semiconductor device in series with the output transistor to hold its collector voltage constant. However, this requires a higher voltage supply or alternatively limits the permissible range of the input and output signals.

SUMMARY OF INVENTION

It is therefore an object of this invention to provide an improved error compensated current mirror.

It is a further object of this invention to provide such an error compensated current mirror which compensates for the Early voltage error and thermal error.

It is a further object of this invention to provide such an error compensated current mirror which does not limit the input and output signal levels.

It is a further object of this invention to provide such an error compensated current mirror which does not require increased voltage supply.

It is a further object of this invention to provide such an error compensated current mirror which applies to bipolar and field effect transistors alike.

The invention results from the realization that a simple, effective error compensated current mirror can be achieved with a compensating circuit which responds to the error variations of a replica of the current mirror output semiconductor to develop a compensating current to offset those errors in the output semiconductor.

This invention features an error compensated current mirror including a current mirror circuit having an input transistor and an output transistor, a bias current source in series with the input transistor and a load current source in series with the output transistor. The load current source includes a load current source transistor in series with a load current source impedance, an input terminal connected between the bias current source and the input transistor, a buffer circuit including a transistor having its base connected between the load current source and the output transistor, and a buffer biasing current source connected in series with the buffer circuit; the buffer biasing current source includes a buffer biasing current source transistor in series with a buffer biasing current source impedance, and the buffer biasing current source transistor is a replica device of the output transistor. There is an output terminal connected between the buffer circuit and the buffer biasing current source. A compensating circuit includes a compensator transistor having its base tied to the base of the buffer biasing current source transistor, its emitter connected between the buffer transistor and the buffer biasing current source impedance and its collector connected between the load current source impedance and the load current source transistor for driving the load current source to supply a current to the output transistor which is matched to that demanded by the buffer biasing current source transistor.

This invention also features an error compensated current mirror including a current mirror circuit having an input semiconductor device and an output semiconductor device, a bias current source in series with the input semiconductor device and a load current source in series with the output semiconductor device. The load current source includes a load current source semiconductor in series with a load current source impedance, an input terminal connected between the bias current source and the input semiconductor device, a buffer circuit including a buffer semiconductor device having one of its load electrodes connected between the load current source and the output semiconductor device, and a buffer biasing current source connected in series with the buffer circuit. The buffer biasing current source includes a buffer biasing current source semiconductor in series with a buffer biasing current source impedance; the buffer biasing current source semiconductor is a replica device of the output semiconductor device. There is an output terminal connected between the buffer circuit and the buffer biasing current source. A compensating circuit includes a compensator semiconductor having its control electrode tied to the control electrode of the buffer semiconductor device, one of its load terminals connected between the buffer biasing current source semiconductor and the buffer biasing current source impedance and its other load electrode connected between the load current source impedance and the load current source semiconductor for driving the load current source to supply a current to the output semiconductor which is matched to that demanded by the buffer biasing current source semiconductor.

DISCLOSURE OF PREFERRED EMBODIMENT

Other objects, features and advantages will occur to those skilled in the art from the following description of a preferred embodiment and the accompanying drawings, in which.

Figure 1:
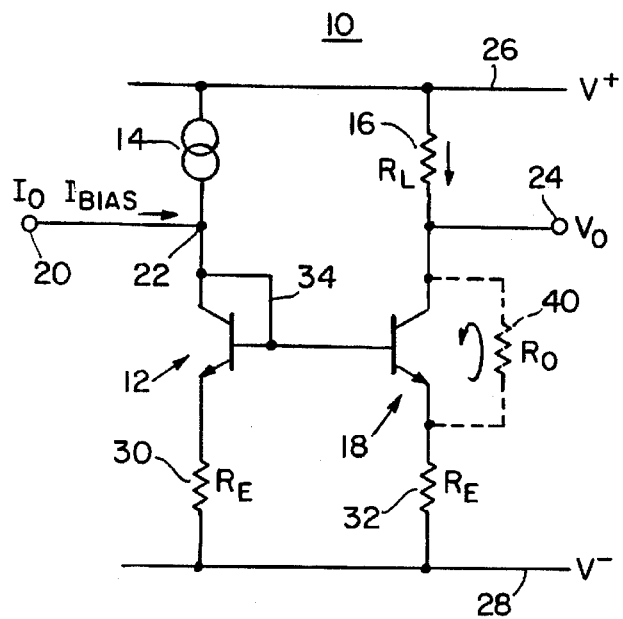
FIG. 1 is a schematic diagram of a prior art current mirror.
Figure 2:
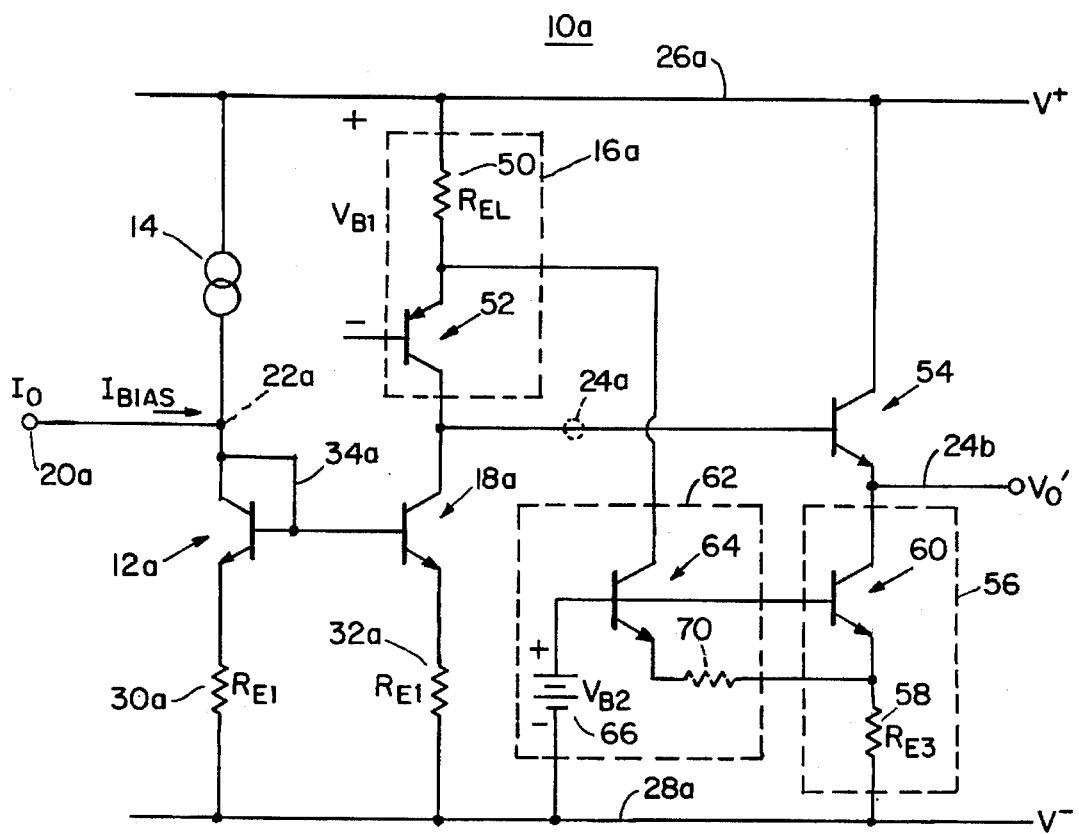
FIG. 2 is a schematic diagram of an error compensated current mirror according to this invention.

There is shown in FIG. 1 a prior art current mirror 10 including an input semiconductor device 12 and bias current source 14, load resistance 16 and output semiconductor device 18. Any kind of semiconductor devices may be used although here devices 12 and 18 are shown as bipolar NPN transistors. An input signal is applied to input terminal 20 which is interconnected at point 22 between bias current source 14 and input semiconductor device 12. Output terminal 24 is connected between load resistor 16 and output semiconductor device 18. The circuit is operated between voltage supplies V+26 and V−28. The emitters of both semiconductor devices 12 and 18 are tied to the low voltage supply 28 by emitter resistors 30 and 32. The collector of semiconductor device or transistor 12 is connected to its base by conductor 34. This ensures that any change in voltage on the collector of transistor 12 is reflected at the base of transistor 12 and also the base of transistor 18, so that if transistor 12 is driven to conduct more or less transistor 18 is similarly driven to conduct more or less.

In operation, current source 14 supplies a constant biasing current through transistor 12 and resistor 30. The voltage at point 22 is reflected by conductor 34 to the base of transistor 12 and the base of transistor 18 so that they conduct similarly. When an input signal $I_o$ is applied to input terminal 20 the additional current conducted by transistor 12 increases the voltage at point 22 and thus increases the voltage that is reflected from the collector of transistor 12 through conductor 34 to the bases of transistors 12 and 18. This causes transistor 18 to conduct more current similar to transistor 12 and this in turn drives up the voltage $V_O$ at output terminal 24 so that the output voltage $V_O$ accurately follows changes in the input current $I_O$.

Two problems occur with current mirror 10. First, even though transistors 12 and 18 are made identical and placed in close proximity to one another and on the same wafer, they still may be subjected to temperature differences which take a long time to equilibrate. For example, often a dielectric such as glass is placed between transistors 12 and 18 so that when the voltage across transistor 18 rises, transistor 18 is subjected to more heating than transistor 12 whose collector voltage remains constant. Due to the thermal insulation of the glass dielectric between them, an increase in the heat generated by transistor 18 is not instantaneously transferred to transistor 12. Thus the change in the current demands by transistor 18 due to the thermal stressing are not instantaneously reflected by transistor 12 and so the accuracy of the output $V_O$ following the input $I_O$ deteriorates.

A second source of error in current mirror 10 comes from the impedance error which in circuits using bipolar transistors is known as the Early voltage. The Early voltage may be envisioned in terms of its disruption of the circuit operation as an equivalent resistor $R_O$ 40 connected across the collector and emitter terminals of transistor 18. The problem occurs because $R_O$ appears as if it is in parallel with the load resistance 16 $R_L$. Thus the full current that should be flowing through $R_L$ is actually decreased by the amount of current flowing in parallel through the output resistance 40 and again, therefore, the accuracy of the output in following the input current $I_O$ is deleteriously affected.

Current mirror 10a according to this invention addresses both of those problems. Load resistance 16a is implemented by resistance 50 and transistor 52 which together constitute a current source. A buffer amplifier 54 is added which receives on its base the output 24a or the $V_O$ output from the prior art. The emitter of buffer 54 provides a new output 24b $V_O$'. The collector of buffer 54 is connected to the positive V+rail 26a. The emitter of buffer 54 in addition to being connected to output 24b is connected to a buffer biasing current source 56 which includes a resistance 58 and transistor 60. A compensating circuit 62 includes transistor 64 with its base connected to some suitable biasing device such as battery 66. The base of transistor 64 is connected directly to the base of transistor 60 so they are both biased the same. The emitter of transistor 64 is connected between transistor 60 and resistor 58. The collector of transistor 64 is connected between resistance 50 and transistor 52.

In operation, any increase or decrease in current in transistor 18a due to the Early error or thermal error would be duplicated in transistor 60 since it is a replica of transistor 18a. By replica is meant a transistor that has similar characteristics but it need not be exactly the same size. If it is not, then transistor 64 can be sized to compensate for any scale differences between the two or a resistance 70 may be added for the same scaling purposes. Any change then in the current flow through transistor 60 because of thermal or Early conditions will be virtually the same as what occurs in transistor 18a. Assume for example that the current in transistor 60 has increased due to an increase in temperature. Assume that the heating conditions applied to both transistor 18a and transistor 60 have caused an increase in current through their respective collectors. The increased current flow in transistor 60 requires a decrease in the current through transistor 64 in order that the voltage across resistor 58 remain constant. The decrease in current through transistor 64 means that there must be an increase in the flow of current through transistor 52 and thus a concomitant increase in the current flow through transistor 18a. Thus the increase in current flow through transistor 60 has created a matching increase in current flow through transistor 18a to compensate for the thermal error. The system operates whether the current error is an increase or a decrease and whether it is due to the Early error or a thermal error.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. An error compensated current mirror comprising:

a current mirror circuit having an input transistor and an output transistor;

a bias current source in series with said input transistor and a load current source in series with said output transistor; said load current source including a load current source transistor in series with a load current source impedance;

an input terminal connected between said bias current source and said input transistor;

a buffer circuit including a transistor having its base connected between said load current source and said output transistor;

a buffer biasing current source connected in series with said buffer circuit, said buffer biasing current source including a buffer biasing current source transistor in series with a buffer biasing current source impedance; said buffer biasing current source transistor being a replica device of said output transistor;

an output terminal connected between said buffer circuit and said buffer biasing current source; and a compensating circuit including a compensator transistor having its base tied to the base of said buffer biasing current source transistor, its emitter connected between said buffer transistor and said buffer biasing current source impedance and its collector connected between said load current source impedance and said load current source transistor for driving said load current source to supply a current to said output transistor which is matched to that demanded by said buffer biasing current source transistor.

2. An error compensated current mirror comprising:

a current mirror circuit having an input semiconductor device and an output semiconductor device;

a bias current source in series with said input semiconductor device and a load current source in series with said output semiconductor device; said load current source including a load current source semiconductor in series with a load current source impedance;

an input terminal connected between said bias current source and said input semiconductor device;

a buffer circuit including a buffer semiconductor device having one of its load electrodes connected between said load current source and said output semiconductor device;

a buffer biasing current source connected in series with said buffer circuit; said buffer biasing current source including a buffer biasing current source semiconductor in series with a buffer biasing current source impedance; said buffer biasing current source semiconductor being a replica device of said output semiconductor device;

an output terminal connected between said buffer circuit and said buffer biasing current source; and a compensating circuit including a compensator semiconductor having its control electrode tied to said control electrode of said buffer semiconductor device, one of its load terminals connected between said buffer biasing current source semiconductor and said buffer biasing current source impedance and its other load electrode connected between said load current source impedance and said load current source semiconductor for driving said load current source to supply a current to said output semiconductor which is matched to that demanded by said buffer biasing current source semiconductor.

* * * * *

UNITED STATES PATENT AND TRADEMARK OFFICE
CERTIFICATE OF CORRECTION

PATENT NO. : 5,637,993
DATED : June 10, 1997
INVENTOR(S) : David H. Whitney
Moshe Gerstenhaber It is certified that error appears in the above-identified patent and that said Letters Patent is hereby corrected as shown below:

ON THE TITLE PAGE

Item [75] Inventor:

Please change the second inventor's last name from "Gerstanhaber" to --Gerstenhaber--.

Signed and Sealed this

Seventeenth Day of February, 1998

Attest:

BRUCE LEHMAN

Attesting Officer          Commissioner of Patents and Trademarks